United States Patent
Jeong et al.

(10) Patent No.: US 9,206,038 B2
(45) Date of Patent: Dec. 8, 2015

(54) CAPACITIVE MICRO-MACHINED ULTRASONIC TRANSDUCER AND METHOD OF SINGULATING THE SAME

(71) Applicant: Samsung Electronics Co., Ltd., Suwon-si (KR)

(72) Inventors: Byung-gil Jeong, Yongin-si (KR); Seog-woo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/298,195

(22) Filed: Jun. 6, 2014

(65) Prior Publication Data

US 2015/0054095 A1  Feb. 26, 2015

(30) Foreign Application Priority Data

Aug. 26, 2013 (KR) .......................... 10-2013-0101286

(51) Int. Cl.
*B81C 1/00* (2006.01)
*B06B 1/02* (2006.01)
*H04R 19/00* (2006.01)

(52) U.S. Cl.
CPC .......... *B81C 1/00888* (2013.01); *B06B 1/0292* (2013.01); *B81B 2201/0271* (2013.01); *H04R 19/005* (2013.01)

(58) Field of Classification Search
None
See application file for complete search history.

(56) References Cited

U.S. PATENT DOCUMENTS

| 2008/0194053 A1* | 8/2008 | Huang ............................. 438/53 |
| 2013/0029476 A1 | 1/2013 | Weng et al. |
| 2014/0248745 A1* | 9/2014 | Wu et al. ........................ 438/114 |

FOREIGN PATENT DOCUMENTS

| JP | 2003-188117 A | 7/2003 |
| KR | 10-0824466 B1 | 4/2008 |
| KR | 10-0908053 A | 7/2009 |
| KR | 10-2011-0138225 A | 12/2011 |

\* cited by examiner

*Primary Examiner* — Yu Chen
*Assistant Examiner* — Nilufa Rahim
(74) *Attorney, Agent, or Firm* — Sughrue Mion, PLLC

(57) ABSTRACT

A capacitive micro-machined ultrasonic transducer (CMUT) and a method of singulating the same. Singulating CMUTs may include forming first trenches in regions of a device wafer defining a plurality of ultrasonic transducer structures, the device wafer including a plurality of the ultrasonic transducer structures, forming an ultrasonic transducer wafer having a plurality of ultrasonic transducers by bonding an electrode pad wafer supplying electricity to the plurality of ultrasonic transducers and the device wafer, and dicing the ultrasonic transducer wafer to form the plurality of ultrasonic transducers by cutting the plurality of ultrasonic transducer structures on the first trench and the electrode pad wafer below the first trench.

8 Claims, 4 Drawing Sheets

CAPACITIVE MICRO-MACHINED ULTRASONIC TRANSDUCER AND METHOD OF SINGULATING THE SAME

RELATED APPLICATIONS

This application claims priority from Korean Patent Application No. 10-2013-0101286, filed on Aug. 26, 2013, in the Korean Intellectual Property Office, the disclosure of which is incorporated herein in its entirety by reference.

BACKGROUND

1. Field

Apparatuses and methods consistent with exemplary embodiments relate to capacitive micro-machined ultrasonic transducers and methods of singulating the same.

2. Description of the Related Art

A micro-machined ultrasonic transducer (MUT) may transform an electrical signal to an ultrasonic signal or vice versa. The MUT may be classified into a piezoelectric micro-machined ultrasonic transducer (PMUT), a capacitive micro-machined ultrasonic transducer (CMUT), or a magnetic micro-machined ultrasonic transducer (MMUT) according to a method of transformation.

A MUT forms a micro-machined ultrasonic transducer module when combined with an application-specific integrated circuit (ASIC) that includes a driving circuit. A micro-machined ultrasonic transducer wafer on which a plurality of MUTs are formed may be separated into a plurality of MUTs using a mechanical method, for example, by using a rotating saw blade.

When singulating MUTs using a mechanical method, edges of the MUTs may be damaged. In particular, since a cavity is included in an upper layer of each MUT, vibrations may occur in the upper layer when the upper layer of the MUTs is sawed, thus causing a cut region to expand. Therefore, electrode pads around the cutting regions may be damaged, thereby reducing a singulated yield of MUTs.

SUMMARY

One or more exemplary embodiments provide methods of singulating capacitive micro-machined ultrasonic transducers (CMUTs) in which trenches are formed in advance in cutting regions.

According to an aspect of an exemplary embodiment, there is provided a capacitive micro-machined ultrasonic transducer includes: a device substrate; a supporting unit on the device substrate which includes a plurality of cavities; a membrane on the supporting unit which covers the plurality of cavities; an upper electrode on the membrane; and an electrode pad substrate on a lower surface of the device substrate, wherein, a first protrusion unit protruding at a side of the device substrate, and a second protrusion unit protruding from the electrode pad substrate at a same side as the first protrusion unit.

The first protrusion unit may protrude in a range from about 10 μm to about 30 μm from the side of the device substrate.

The first protrusion unit may be formed in a location corresponding to the supporting unit, the membrane, and the upper electrode.

The second protrusion unit may protrude in a range from about 10 μm to about 30 μm from the electrode pad substrate at the same side as the first protrusion unit.

The first and second protrusion units may protrude substantially the same length from a side of the capacitive micro-machined ultrasonic transducer.

According to an aspect of an exemplary embodiment, there is provided a method of singulating a capacitive micro-machined ultrasonic transducer, the method including: forming first trenches in regions of a device wafer, the device wafer including a plurality of the ultrasonic transducer structures thereon; forming an ultrasonic transducer wafer having a plurality of ultrasonic transducers by bonding an electrode pad wafer and the device wafer; and dicing the ultrasonic transducer wafer to singulate each of the plurality of ultrasonic transducers by cutting the plurality of ultrasonic transducer structures at the first trench and the electrode pad wafer below the first trench.

The forming of the first trenches may include forming through holes in the device wafer using a dry etching method.

The dicing of the ultrasonic transducer wafer may be performed using a saw blade, wherein a width of the first trenches is greater than a cutting width of the saw blade.

Second trenches that define a plurality of elements of the ultrasonic transducer structures may be formed in the device wafer, wherein the forming of the first trenches is performed at the same time as the forming of the second trenches.

A first width of the first trenches may be greater than a width of the second trenches.

The method may further include forming third trenches in the electrode pad wafer corresponding to the first trenches prior to bonding the electrode pad wafer with the device wafer.

The third trenches may have a width greater than the cutting width of the saw blade.

The third trenches may have substantially a same width as the first trenches.

Bonding the electrode pad wafer with the device wafer may include aligning the first trenches with the third trenches.

Forming the third trenches may include forming the third trenches to have a depth in a range from about ½ to about ¾ of a thickness of the electrode pad wafer.

According to an aspect of an exemplary embodiment, there is provided a method of singulating a device, including forming an upper structure including a plurality of device substrates and at least one upper trench, forming a lower structure including a plurality of electrode pad substrates and at least one lower trench, bonding the upper structure with the lower structure to form a device array, and dicing the device array at the at least one upper trench and at least one lower trench to singulate each device of the device array. The dicing the device array may form a first protrusion unit protruding at a side of the device substrate, and a second protrusion unit protruding from the electrode pad substrate at a same side as the first protrusion unit.

A location of the at least one lower trench may correspond with a location of the at least one upper trench.

The at least one upper trench and at least one lower trench may be formed using a dry etching process.

At least one element trench used to separate elements of a device may be formed.

The at least one upper trench and at least one lower trench may surround a border of a device of the device array.

The devices may be capacitive micro-machined ultrasonic transducers

BRIEF DESCRIPTION OF THE DRAWINGS

The above and/or other aspects will become apparent and more readily appreciated from the following description of aspects of exemplary embodiments, taken in conjunction with the accompanying drawings in which.

DETAILED DESCRIPTION

Figure 1:
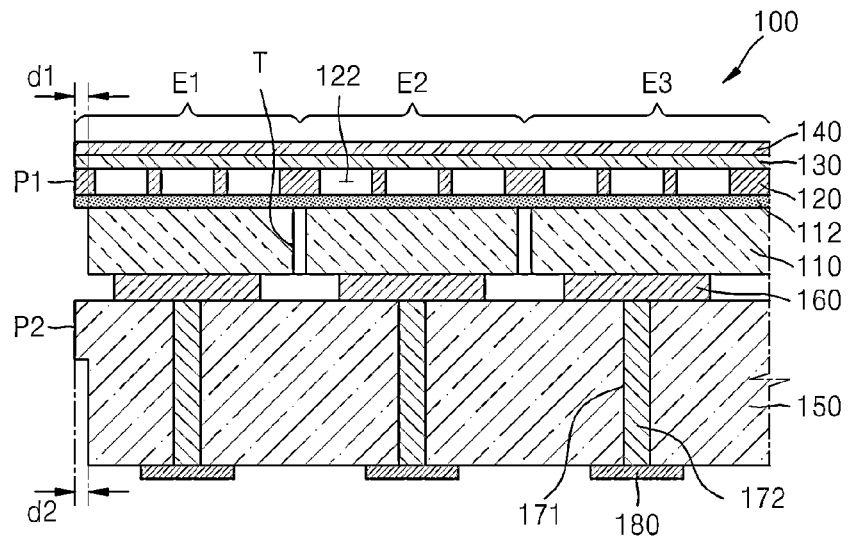
FIG. 1 is a schematic cross-sectional view of a structure of a capacitive micro-machined ultrasonic transducer according to exemplary embodiments.

Exemplary embodiments will now be described more fully, examples of which are illustrated in the accompanying drawings. In the drawings, the thicknesses of layers and regions may be exaggerated for clarity. It should be understood that the exemplary embodiments described below are merely examples, and thus, may be modified in many different forms. When a layer or a region is referred to as being "on" or "above" another element, it can be directly on the other layer or region, or intervening layer(s) may also be present. Like reference numerals are used to denote like elements throughout the specification, and thus their description will be omitted.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by various exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

FIG. 1 is a schematic cross-sectional view of a structure of a capacitive micro-machined ultrasonic transducer (CMUT) 100 that is diced by using a singulation method according to exemplary embodiments.

Referring to FIG. 1, the CMUT 100 may include a plurality of elements E1 through E3, and each of the elements E1 through E3 may include at least one cavity 122. Here, the elements E1 through E3 may be separated from each other by trenches T, which are element separation lines for preventing cross-talk and electrical signal connections between the elements E1 through E3.

The CMUT 100 may include a device substrate 110, an ultrasonic transducer structure on the device substrate 110, and an electrode pad substrate 150 provided under the device substrate 110. The ultrasonic transducer structure may include a supporting unit 120, a membrane 130, and an upper electrode 140 which are provided on the device substrate 110. The device substrate 110 may function as a lower electrode. The device substrate 110 may be formed of, for example, a low resistance silicon substrate having highly doped impurities, or the like.

An upper insulating layer 112 may be formed on an upper surface of the device substrate 110. The upper insulating layer 112 may include, for example, a silicon oxide, but is not limited thereto. Trenches T, which may be used as element separation lines, are formed in the device substrate 110. The trenches T may have rectangular shapes which define borders of elements E1 through E3.

The supporting unit 120 may include a plurality of cavities 122 and may be formed on the upper insulating layer 112. The supporting unit 120 may include, for example, a silicon oxide, but is not limited thereto. The membrane 130 may be formed on the supporting unit 120 and cover the cavities 122. The membrane 130 may be formed of, for example, silicon, but is not limited thereto.

The upper electrode 140 may be formed on the membrane 130. The electrode pad substrate 150 may be formed under the device substrate 110. Electricity may be supplied to the device substrate 110, which is a lower electrode, through the electrode pad substrate 150. The electrode pad substrate 150 may be, for example, a silicon substrate, but is not limited thereto. The device substrate 110 and the electrode pad substrate 150 may be combined with one another by bonding layers 160 disposed therebetween. Each of the bonding layers 160 may be formed to correspond to each element region. The bonding layers 160 may be formed of two metals that forms a eutectic bonding therebetween. For example, bonding layers 160 may be Au—Sn bonding layers or the like.

Through holes 171 that correspond to the bonding layers 160 may be formed in the electrode pad substrate 150. The through holes 171 may be filed with via metals 172. The via metals 172 may be electrically connected to the bonding layers 160. Electrode pads 180 that contact the via metals 172 may be formed on a lower surface of the electrode pad substrate 150. Electricity supplied to the electrode pad 180 may be transmitted to the device substrate 110 through the via metal 172 and the bonding layer 160. The upper electrode 140 may be a common electrode. Electricity may be supplied to the upper electrode 140 through an additional via metal (not shown) formed in the electrode pad substrate 150 and the device substrate 110.

The electrode pad substrate 150 may be a silicon substrate. When the electrode pad substrate 150 is a formed of a conductive silicon substrate, an insulating film (not shown) that insulates the bonding layer 160, the via metal 172, and the electrode pad 180 from the electrode pad substrate 150 may further be formed thereon.

The CMUT 100 may be obtained by dicing a structure manufactured at a wafer level. The CMUT 100 may also be referred to as a CMUT chip 100. The CMUT 100 may have an approximately rectangular shape and may have two protrusion units P1 and P2 formed on the surface of at least one side of a diced CMUT 100. The protrusion units P1 and P2 may protrude from a side of the CMUT 100. The first protrusion P1 may be formed on an upper portion of the device substrate 110. A region where a first protrusion unit P1 is formed may be a region on which an upper insulating layer 112, a supporting unit 120, a membrane 130, and an upper electrode 140 are formed.

The second protrusion unit P2 may be formed on an upper portion of the electrode pad substrate 150. A first protrusion distance d1 of the first protrusion unit P1 may be in a range from about 10 μm to about 30 μm, and a second protrusion distance d2 of the second protrusion unit P2 may be in a range from about 10 μm to about 30 μm. The second protrusion unit P2 may be formed to have a length in a range from about ¼ to about ½ of a height of the electrode pad substrate 150. The first protrusion distance d1 and the second protrusion distance d2 may be substantially the same.

In FIG. 1, three elements E1 through E3 are included in the CMUT 100 for convenience, but the current exemplary embodiment is not limited thereto. The CMUT 100 may include an m×n array of elements. For example, the CMUT 100 may include 256 elements disposed in 16×16 arrays.

FIG. 1 shows a CMUT as an example. However, a CMUT diced according to an exemplary embodiment may have various structures different from the structure of FIG. 1.

FIGS. 2A through 2E are cross-sectional views showing a method of singulating a CMUT according to exemplary embodiments. Like reference numerals are used to indicate elements that are substantially identical to the elements of FIG. 1, and detailed descriptions thereof will not be repeated.

Figure 2A:
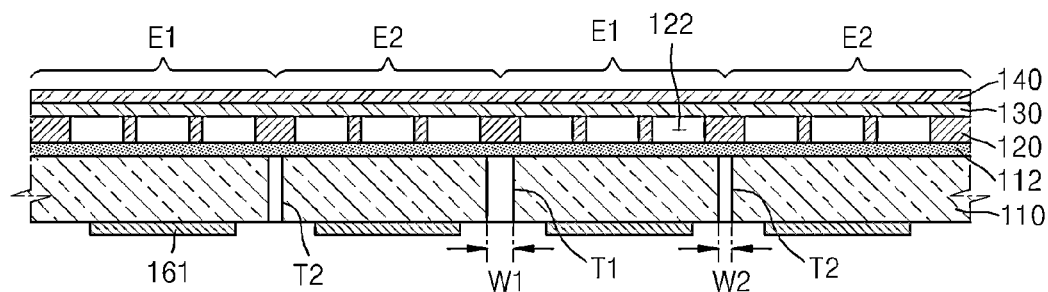
FIGS. 2A through 2E are cross-sectional views showing a method of singulating a capacitive micro-machined ultrasonic transducer according to exemplary embodiments.

FIG. 2A is a cross-sectional view showing preparation of a device wafer. The device wafer includes a plurality of device substrates 110. Hereinafter, a structure formed of a plurality of device substrates 110 is referred to as a device wafer 110.

A first trench T1 defining a region of a single CMUT 100 is formed in the device wafer 110. A plurality of elements E1 and E2 are formed in each of the CMUT regions. Second trenches T2 may be formed in each CMUT region and may be used as element separation lines that separate the elements E1 and E2. The first trench T1 may be formed at the same time when the second trenches T2 are formed. The first trench T1 may have a first width W1 which is greater than a second width W2 of the second trenches T2. The first width W1 of the first trench T1 may be greater than a cutting width W4 (refer to FIG. 2D) of a saw blade 190 (refer to FIG. 2D) used to cut the device wafer 110 in a sawing process that will be described later. For example, when the cutting width W4 of a saw blade 190 is 40 μm, the first width W1 may be in a range from about 60 μm to about 100 μm.

The upper insulating layer 112, the supporting unit 120, the membrane 130, and the upper electrode 140 may be sequentially formed on the device wafer 110.

The first trench T1 may be formed to fit a line on which a saw blade passes in a process of dicing a plurality of CMUTs 100. The first trench T1 may have a rectangular shape and surround a single CMUT 100.

First bonding layers 161 may be formed on a lower surface of the device wafer 110. For example, the first bonding layers 161 may be formed to correspond to each of the elements on the lower surface of the device wafer 110. The first bonding layers 161 may be formed to be electrically separated from each other. The first bonding layers 161 may be formed by patterning a metal layer after forming the metal layer on the lower surface of the device wafer 110. The first bonding layers 161 may be Ti/Au layers. A titanium (Ti) layer may be referred to as an adhesive layer.

The device wafer 110 may be formed to have a thickness in a range from about 20 μm to about 25 μm, and a device structure including cavity 122 on the device wafer 110 may have a thickness of approximately 1 μm.

The first trench T1 and the second trenches T2 may be formed using a dry etching process that is generally used in semiconductor processes.

Figure 2B:
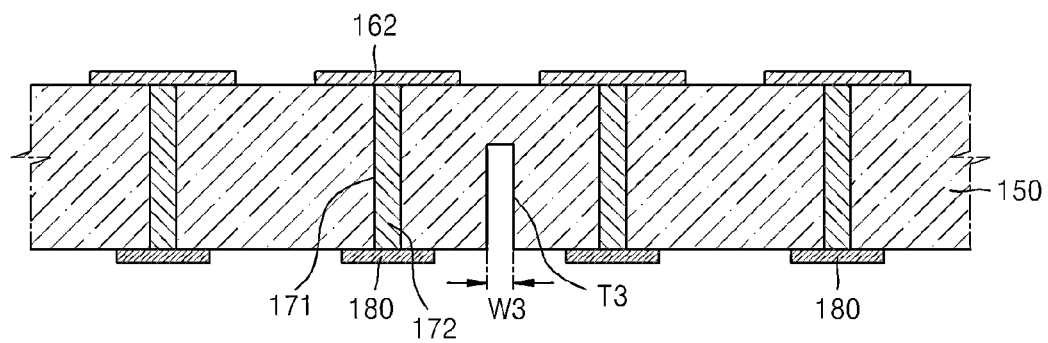

FIG. 2B is a cross-sectional view showing a process of preparing an electrode pad wafer. The electrode pad wafer may include a plurality of electrode pad substrates 150. Hereinafter, the structure formed of plural electrode pad substrates 150 is referred to as an electrode pad wafer 150.

Through holes 171 corresponding to each of the CMUT regions may be formed in the electrode pad wafer 150, and the through holes 171 may be filled with a via metal 172. Second bonding layers 162 corresponding to the first bonding layers 161 may be formed on an upper surface of the electrode pad wafer 150. The second bonding layers 162 may be formed of a material, for example, a Sn layer that forms a eutectic bond with an Au layer of the first bonding layers 161. In an exemplary embodiment, the second bonding layers 162 may be formed of Ti/Ni/Au/Sn/Au layers. The uppermost Au layer may be formed to prevent oxidation of the Sn layer. The second bonding layers 162 may be formed through a patterning process after depositing an electrode material on the electrode pad wafer 150. Electrode pads 180 may be formed on a lower surface of the electrode pad wafer 150.

When the electrode pad wafer 150 is formed of silicon, an insulating layer (not shown) that prevents the via metals 172, the second bonding layers 162, and the electrode pads 180 from contacting the electrode pad wafer 150 may further be formed to prevent electrification between element regions. The insulating layer may be formed of silicon oxide or the like.

Third trenches T3, which may define each of the CMUT regions, may be formed in the electrode pad wafer 150. The third trenches T3 may be formed in the electrode pad wafer 150 at locations corresponding to the first trenches T1. The third trenches T3 may be formed by using a dry etching process. The third trenches T3 may have a depth in a range from about ½ to about ¾ of a thickness of the electrode pad wafer 150. A width W3 of the third trenches T3 may be formed to be substantially the same as the first width W1 of the first trench T1.

Figure 2C:
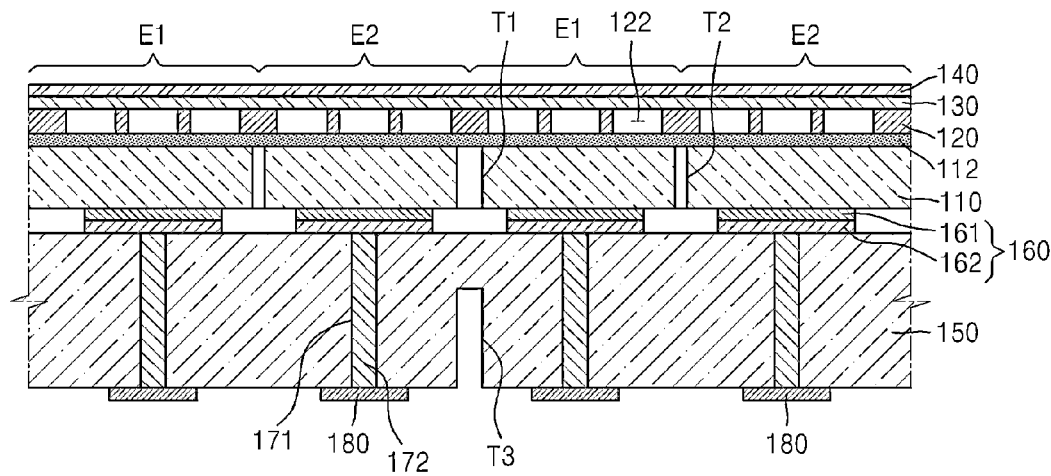

Referring to FIG. 2C, the device wafer 110 and the electrode pad wafer 150 may be bonded. The device wafer 110 may be aligned with the electrode pad wafer 150 so that the first bonding layers 161 of the device wafer 110 contacts the second bonding layers 162 of the electrode pad wafer 150. At this point, the first trench T1 is aligned with the third trench T3. Next, when a temperature greater than 280° C. is applied to the first bonding layers 161 and the second bonding layers 162, a eutectic metal may be formed between the first bonding layers 161 and the second bonding layers 162, and thus, the device wafer 110 and the electrode pad wafer 150 may be bonded to each other. Bonding layer 160 is a resultant product of eutectic bonding of the first bonding layers 161 and the second bonding layers 162. A structure in which the device wafer 110 is combined with the electrode pad wafer 150, may include a plurality of ultrasonic transducers, referred to as an ultrasonic transducer wafer.

Figure 2D:
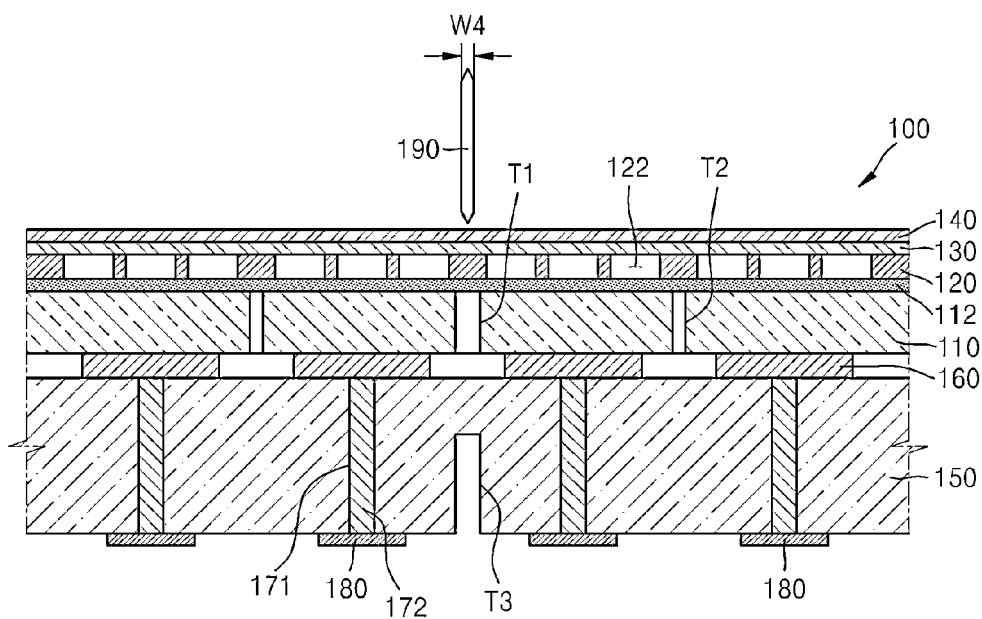

Referring to FIG. 2D, a boundary region between the ultrasonic transducers may be cut by using a saw blade 190 of a saw machine. A boundary region may be a straight line formed by aligning the first trench T1 with the third trench T3. When the CMUT 100 is sawed by using the saw machine along the first trench T1 on the device wafer 110, the device structure on the device wafer 110 may be easily cut by the saw blade 190 at the first trench T1. The electrode pad wafer 150 on the third trench T3 may then be cut.

Figure 2E:
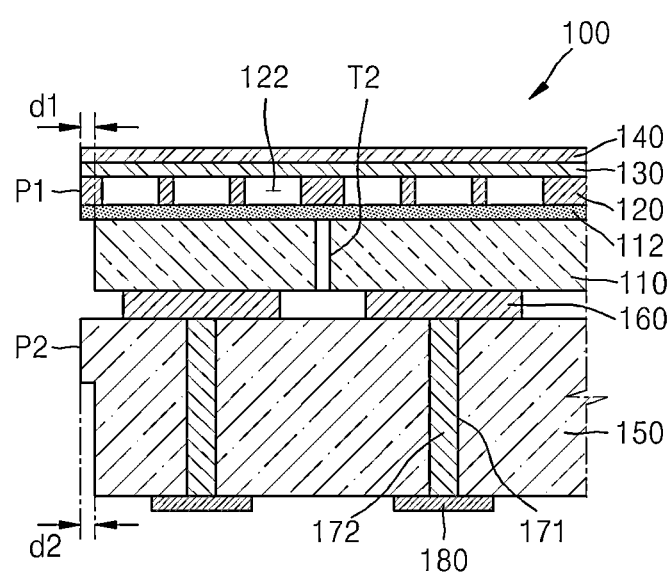

Referring to FIG. 2E, a diced CMUT 100 may be obtained. The CMUT 100 may be referred to as a CMUT chip 100. The CMUT 100 may have an approximately a rectangular shape and each diced side surface may include two protrusion units P1 and P2. The first protrusion unit P1 may be formed above the device wafer 110 and protrude at a side of the CMUT 100.

The second protrusion unit P2 may be formed on an upper portion of the electrode pad substrate 150 and protrude at a side of the CMUT 100. A first protrusion distance d1 of the first protrusion unit P1 may be in a range from about 10 μm to about 30 μm, and a second protrusion distance d2 of the second protrusion unit P2 may be in a range from about 10 μm to about 30 μm. In one exemplary embodiment, the first protrusion distance d1 and the second protrusion distance d2 may be substantially the same.

According to the described singulation method, in the singulation process of the CMUT chips 100, a device structure on the first trench T1 is easily cut because the device structure has a small thickness, and the electrode pad wafer 150 is easily cut because the electrode pad wafer 150 on the third trench T3 has a small thickness.

Accordingly, damage to edge regions of the CMUT chips 100 is reduced, thus reducing a product failure rate.

Figure 3:
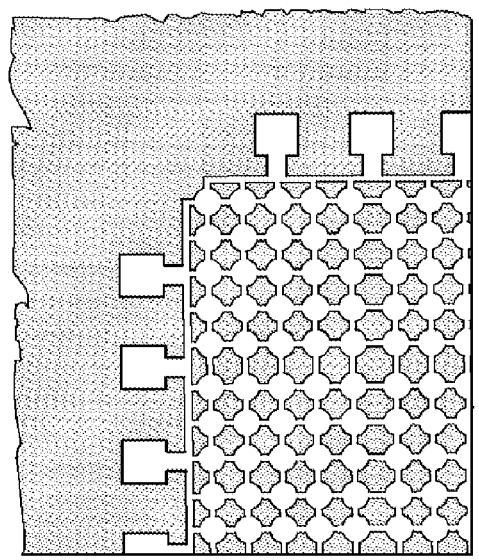
FIG. 3 is a photo image showing an upper shape of a micro-machined ultrasonic transducer chip that is formed by dicing using a saw machine.
Figure 4:
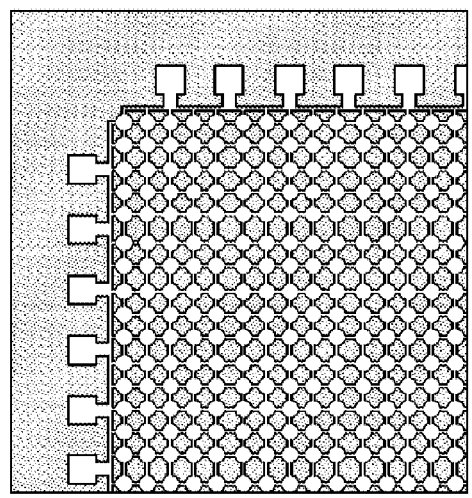
FIG. 4 is a photo image showing an upper shape of a micro-machined ultrasonic transducer chip that is formed by using a singulation method according to exemplary embodiments.

FIG. 3 is an image showing an upper shape of a micro-machined ultrasonic transducer chip formed by dicing using a saw machine. FIG. 4 is an image showing an upper shape of a micro-machined ultrasonic transducer chip formed by using a singulation method according to exemplary embodiments.

Referring to FIG. 3, edges of CMUT chips may be damaged during the sawing process and a surface having been cut may be very rough.

Referring to FIG. 4, edges of CMUT chips cut according to the singulation method of the exemplary embodiments may be clean and undamaged.

According to the singulation method described above, in the singulation process of CMUT chips 100, a device structure on the first trench T1 is easily cut because the device structure has a small thickness, and the electrode pad wafer 150 is easily cut because the electrode pad wafer 150 on the third trench T3 has a small thickness.

Accordingly, damage to edges of the CMUT chips may be reduced, and thus, a product failure rate with respect to the singulation process is reduced.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the exemplary embodiments have been described with reference to the figures, it will be understood by those of ordinary skill in the art that various changes in form and details may be made therein without departing from the spirit and scope of the exemplary embodiments as defined by the following claims.

What is claimed is:

1. A method of singulating a capacitive micro-machined ultrasonic transducer (CMUT), the method comprising:
   forming first trenches in regions of a device wafer, the device wafer including a plurality of ultrasonic transducer structures thereon;
   forming an ultrasonic transducer wafer having a plurality of ultrasonic transducers by bonding an electrode pad wafer and the device wafer;
   dicing the ultrasonic transducer wafer to singulate each of the plurality of ultrasonic transducers by cutting the plurality of ultrasonic transducer structures at the first trench and the electrode pad wafer below the first trench; and
   forming second trenches defining a plurality of elements corresponding to each of the plurality of it sonic transducer structures in the device wafer, wherein the forming of the first trenches is performed at the same time as the forming of the second trenches,
   wherein a width of the first trenches is greater than a width of the second trenches.

2. The method of claim 1, wherein the forming of the first trenches comprises forming through holes in the device wafer using a dry etching method.

3. The method of claim 1, wherein the dicing of the ultrasonic transducer wafer is performed using a saw blade, wherein a width of the first trenches is greater than a cutting width of the saw blade.

4. The method of claim 1, further comprising forming third trenches in the electrode pad wafer corresponding to the first trenches prior to bonding the electrode pad wafer with the device wafer.

5. The method of claim 4, wherein the third trenches have a width greater than the cutting width of the saw blade.

6. The method of claim 5, wherein bonding the electrode pad wafer with the device wafer includes aligning the first trenches with the third trenches.

7. The method of claim 4, wherein forming the third trenches comprises forming the third trenches to have a depth in a range from about ½ to about ¾ of a thickness of the electrode pad wafer.

8. A method of singulating a capacitive micro-machined ultrasonic transducer (CMUT), the method comprising;
   forming first trenches in regions of a device wafer, the device wafer including a plurality of ultrasonic transducer structures thereon;
   forming an ultrasonic transducer wafer having a plurality of ultrasonic transducers by bonding an electrode pad wafer and the device wafer;
   forming third trenches in the electrode pad wafer corresponding to the first trenches prior to bonding the electrode pad wafer with the device wafer; and
   dicing the ultrasonic transducer wafer to singulate each of the plurality of ultrasonic transducers by cutting the plurality of ultrasonic transducer structures at the first trench and the electrode pad wafer below the first trench,
   wherein the third trenches have substantially same width as the first trenches.

* * * * *